(12) United States Patent
Cheng et al.

(10) Patent No.: US 8,067,292 B2
(45) Date of Patent: Nov. 29, 2011

(54) ISOLATION STRUCTURE, NON-VOLATILE MEMORY HAVING THE SAME, AND METHOD OF FABRICATING THE SAME

(75) Inventors: Ming-Da Cheng, MiaoLi (TW); Chin-Tsan Yeh, Hsinchu (TW); Tuung Luoh, Taipei (TW); Chin-Ta Su, Yunlin County (TW); Ta-Hung Yang, Miaoli County (TW); Kuang-Chao Chen, Hsinchu County (TW)

(73) Assignee: Macronix International Co., Ltd., Hsinchu (TW)

( * ) Notice: Subject to any disclaimer, the term of this patent is extended or adjusted under 35 U.S.C. 154(b) by 60 days.

(21) Appl. No.: 12/343,633

(22) Filed: Dec. 24, 2008

(65) Prior Publication Data

US 2009/0184343 A1 Jul. 23, 2009

Related U.S. Application Data

(60) Provisional application No. 61/022,822, filed on Jan. 23, 2008.

(51) Int. Cl.
*H01L 21/76* (2006.01)
(52) U.S. Cl. ........ 438/424; 438/257; 438/585; 438/294; 438/295; 257/213; 257/506; 257/E21.409; 257/E21.294; 257/E21.54
(58) Field of Classification Search ............... 438/424, 438/257, 585, 296; 257/213, 506, 315
See application file for complete search history.

(56) References Cited

U.S. PATENT DOCUMENTS

| | | | | |
|---|---|---|---|---|
| 6,146,970 A * | 11/2000 | Witek et al. | | 438/424 |
| 7,190,036 B2 * | 3/2007 | Ko et al. | | 257/374 |
| 7,923,363 B2 | 4/2011 | Goarin et al. | | |
| 2002/0119628 A1 * | 8/2002 | Lai | | 438/296 |
| 2003/0235980 A1 * | 12/2003 | Huang et al. | | 438/638 |
| 2004/0061169 A1 * | 4/2004 | Leam et al. | | 257/315 |
| 2005/0205963 A1 | 9/2005 | Johnson et al. | | |
| 2010/0055864 A1 * | 3/2010 | Williams | | 438/424 |

FOREIGN PATENT DOCUMENTS

| | | |
|---|---|---|
| CN | 101019232 | 8/2007 |
| KR | 2001-0063605 | 7/2001 |
| KR | 10-2006-0068232 | 6/2006 |

OTHER PUBLICATIONS

Chinese language office action dated May 31, 2010.
English language translation of abstract of KR 2001-0063605 (published Jul. 9, 2001).
English language translation of abstract KR 10-2006-0068232 (published Jun. 21, 2001).
English language translation of abstract of CN 101019232 (published Aug. 15, 2007).

* cited by examiner

*Primary Examiner* — Jack Chiang
*Assistant Examiner* — Wilner Jean Baptiste
(74) *Attorney, Agent, or Firm* — Thomas|Kayden

(57) ABSTRACT

A method of forming an isolation structure, comprising: (a) providing a base having a recess; (b) forming a stop layer on the base and in the recess; (c) forming a dielectric material on the stop layer so as to allow the rest of the recess to be filled with the dielectric material; (d) removing the dielectric material over the base by performing a chemical mechanical polishing (CMP) process until a part of the stop layer is exposed so as to form a dielectric layer in the recess; and (e) removing a part of the stop layer, wherein the another part of the stop layer and the dielectric layer filled in the recess constitute the isolation structure.

22 Claims, 7 Drawing Sheets

(a)

(b)

(c)

| Refractive Index (@248nm) | CMP removal amount (angstrom) | Selectivity |
|---|---|---|
| 1.516 | 3300 | 3300/3300=1 |
| 1.524 | 2954 | 3300/2954=1.12 |
| 1.537 | 2601 | 3300/2601=1.27 |
| 1.57 | 2214 | 3300/2214=1.49 |
| 1.628 | 1022 | 3300/1022=3.23 |
FIG. 6
FIG. 7A
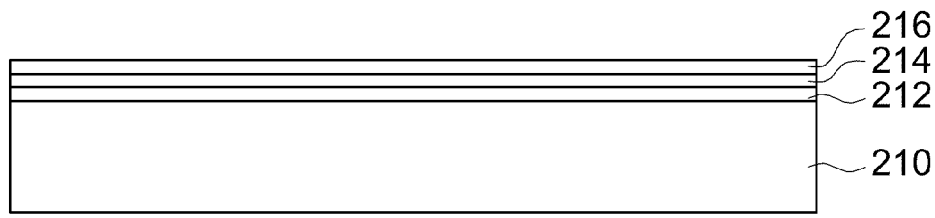
FIG. 7B

ISOLATION STRUCTURE, NON-VOLATILE MEMORY HAVING THE SAME, AND METHOD OF FABRICATING THE SAME

This application claims the benefit of U.S. provisional application Ser. No. 61/022,822, filed Jan. 23, 2008, the subject matter of which is incorporated herein by reference.

BACKGROUND OF THE INVENTION

1. Field of the Invention

The invention relates in general to an isolation structure and a method of fabricating the same, and more particularly to an isolation structure applied to an non-volatile memory, and a method of fabricating the same.

2. Description of the Related Art

Local Oxidation of Silicon (LOCOS) is the traditional isolation technique. At first a very thin silicon oxide layer 12 is grown on the wafer 10, the so-called pad oxide. Then a layer of silicon nitride 14 is deposited which is used as an oxide barrier. The pattern transfer is performed by photolithography. After lithography the pattern is etched into the nitride 14. The result is the nitride mask as shown in FIG. 1a, which defines the active areas for the oxidation process. The next step is the main part of the LOCOS process, the growth of the thermal oxide 12a (see FIG. 1b). After the oxidation process is finished, the last step is the removal of the nitride layer 14 (see FIG. 1c). The main drawback of this technique is the so-called bird's beak effect and the surface area which is lost to this encroachment.

The Shallow Trench Isolation (STI) is another isolation technique. The STI process starts in the same way as the LOCOS process. The first difference compared to LOCOS is that a shallow trench 18 is etched into the silicon substrate 10, as shown in FIG. 2a. A pattern of the resist 16 is transferred to the silicon nitride layer 14, the silicon oxide layer 12, and also part of the silicon substrate 10. After underetching of the oxide pad 12, also a thermal oxide 20 in the trench is grown in the Furnace, the so-called liner oxide (see FIG. 2c). But unlike with LOCOS, the thermal oxidation process is stopped after the formation of a thin oxide layer 20, and the rest of the trench 18 is filled with a deposited oxide 30, which is performed by chemical vapor deposition (see FIG. 2d). Next, the excessive (deposited) oxide is removed with chemical mechanical planarization (see FIG. 2e). At last the nitride mask 14 is also removed (see FIG. 2f). However, the price for saving space with STI is the larger number of different process steps.

Therefore, there exists a requirement of an isolation technique, being capable of solving the above problems without complicating the manufacturing process and increasing the cost.

SUMMARY OF THE INVENTION

The invention is directed to a method of forming an isolation structure and a non-volatile memory having the same, capable of reduce the number of the process steps.

According to a first aspect of the present invention, a method of forming an isolation structure is provided. The method comprises: (a) providing a base having a recess; (b) forming a stop layer on the base and in the recess; (c) forming a dielectric material on the stop layer so as to allow the rest of the recess to be filled with the dielectric material; (d) removing the dielectric material over the base by performing a chemical mechanical polishing (CMP) process until a part of the stop layer is exposed so as to form a dielectric layer in the recess; and (e) removing a part of the stop layer, wherein the another part of the stop layer and the dielectric layer filled in the recess constitute the isolation structure.

According to a second aspect of the present invention, a method of forming a non-volatile memory. The method comprises (a) providing a substrate; (b) forming a plurality of stacking units separately on the substrate so as to allow a recess to be formed between every two stacking units; (d) forming a source region and a drain region in the substrate at two sides of the each stacking unit; (e) forming a stop layer in each of the recess and over the stacking units; (f) forming a dielectric material on the stop layer so as to allow the rest of the recess to be filled with the dielectric material; (g) removing the dielectric material over the substrate by performing a chemical mechanical polishing (CMP) process until a part of the stop layer is exposed so as to form a dielectric layer in each of the recess; and (h) removing the part of the stop layer, wherein the another part of the stop layer and the dielectric layer filled in one of the recess is for isolation two neighboring stacking units.

According to a third aspect of the present invention, a non-volatile memory is provided. The non-volatile memory comprises a substrate, a plurality of memory cells and an isolation structure. Each memory cell comprises a stacking unit, a source region and a drain region. The stacking unit, comprising a gate insulating layer, a charge storage layer and a gate electrode thereon, is formed on the substrate. The source region and a drain region are buried in the substrate at two sides of the stacking units. The isolation structure is formed on the substrate and between every two stacking units. The isolation structure comprises a first and second deposited oxide layer. The first deposited oxide layer extends on the substrate between two stacking units and on a lateral surface of the stacking units. The second deposited oxide layer is formed on the first deposited oxide layer. The refractive index of the second deposited oxide layer is less than the refractive index of the first deposited oxide layer.

According to a fourth aspect of the present invention, an isolation structure is provided. The isolation structure, formed in a recess of a base, comprises first and second deposited oxide layers. The first deposited oxide layer formed on the base, and also extends along a lateral surface and a bottom surface of the recess. The second deposited oxide layer is formed on the first deposited oxide layer. The reset of the recess is filled with the second deposited oxide layer. The refractive index of the second deposited oxide layer is less than the refractive index of the first deposited oxide layer.

The invention will become apparent from the following detailed description of the preferred but non-limiting embodiments. The following description is made with reference to the accompanying drawings.

BRIEF DESCRIPTION OF THE DRAWINGS

FIG. 6 is a chart to illustrate the relation among the refractive index, CMP removal amount, and the selectivity.

FIG. 7A~7H are cross-sectional view schematically illustrating a method of forming a non-volatile memory according to the second embodiment of the present invention.

DETAILED DESCRIPTION OF THE INVENTION

The present invention is directed to a method of forming an isolation structure, comprising: (a) providing a base having a recess; (b) forming a stop layer on the base and in the recess; (c) forming a dielectric material on the stop layer so as to allow the rest of the recess to be filled with the dielectric material; (d) removing the dielectric material over the base by performing a chemical mechanical polishing (CMP) process until a part of the stop layer is exposed so as to form a dielectric layer in the recess; and (e) removing a part of the stop layer, wherein the another part of the stop layer and the dielectric layer filled in the recess constitute the isolation structure.

The isolation structure of the present invention can be widely applied to various semiconductor products, and it is not limited to embodiments listed below. The base of the claimed invention will be different when the isolation structure is applied to different semiconductor products. For example, if the isolation structure is shallow trench isolation (STI), it will be buried in the substrate. If the isolation structure is buried diffusion oxide (BD oxide) isolation, it will be located between two memory cells.

First Embodiment

Figure 1:
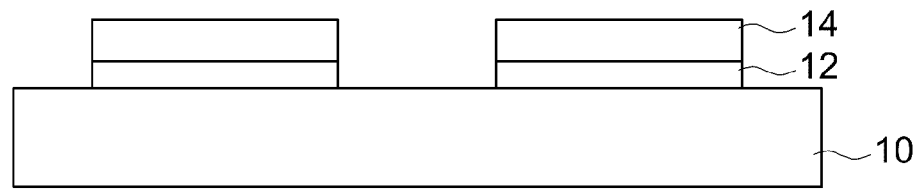
FIG. 1a-1c (Prior Art) are cross-sectional views showing a conventional local oxidation of silicon (LOCOS) process.
Figure 1:
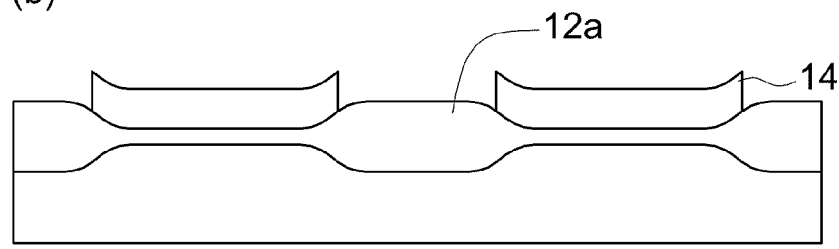
Figure 1:
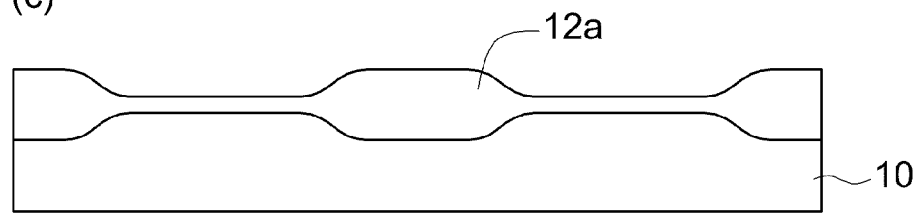
Figure 2:
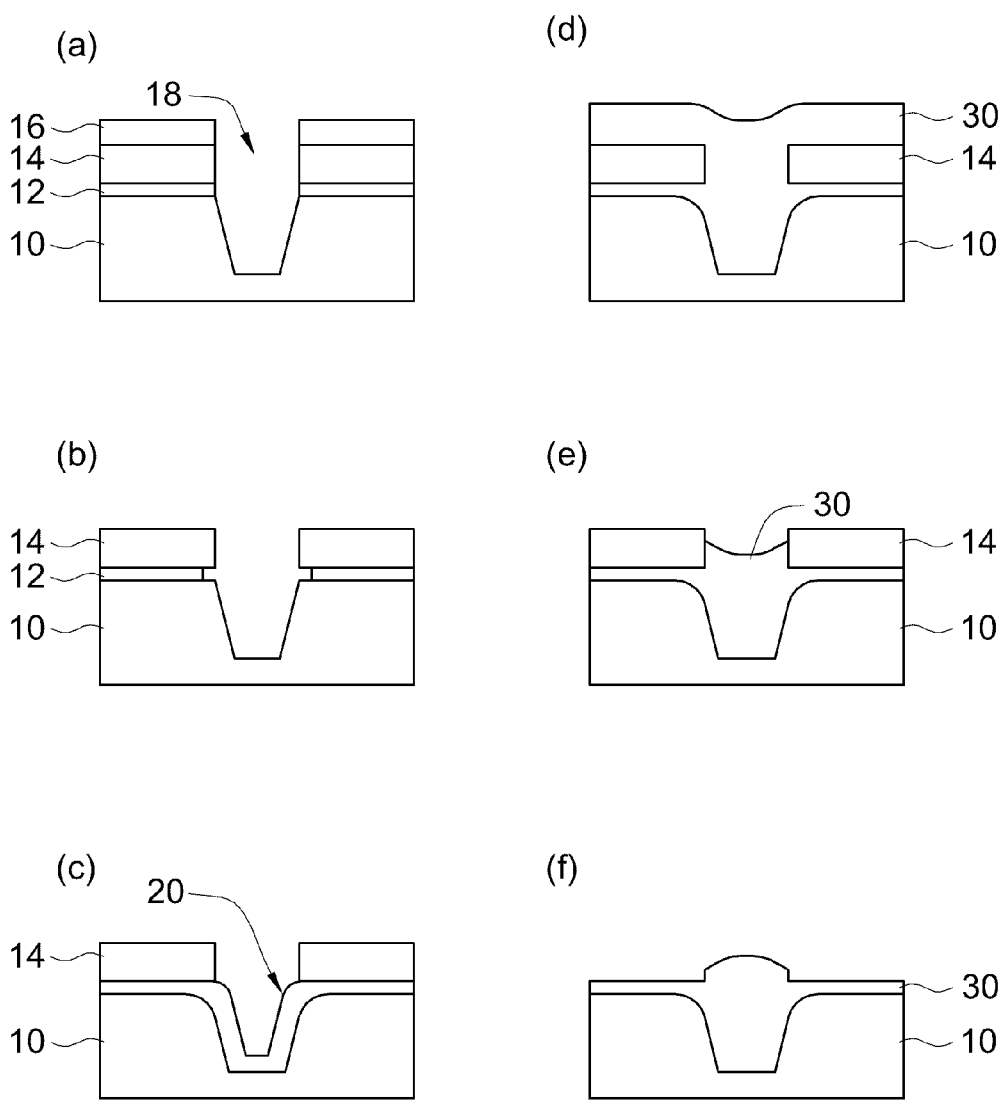
FIG. 2a-2f (Prior Art) are cross-sectional views showing a conventional shallow trench isolation (STI) process.
Figure 3A:
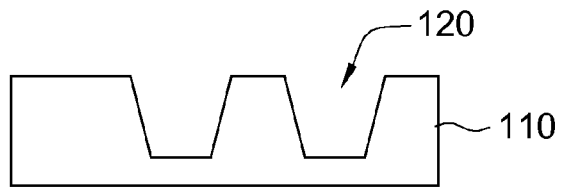
FIG. 3A~3E are cross-sectional view schematically illustrating a method of forming an isolation structure according to the first embodiment of the present invention.

Referring to FIG. 3A~3E, schematically illustrating a method of forming an isolation structure according to the first embodiment of the present invention. The isolation structure of the first embodiment is shallow trench isolation. Firstly, a base 110 having a recess 120 is provided. The base 110 is a substrate, and the substrate is etched to form a trench, as shown in FIG. 3A.

Figure 3B:
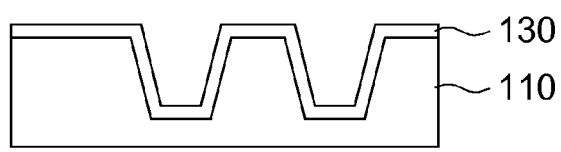
Figure 4:
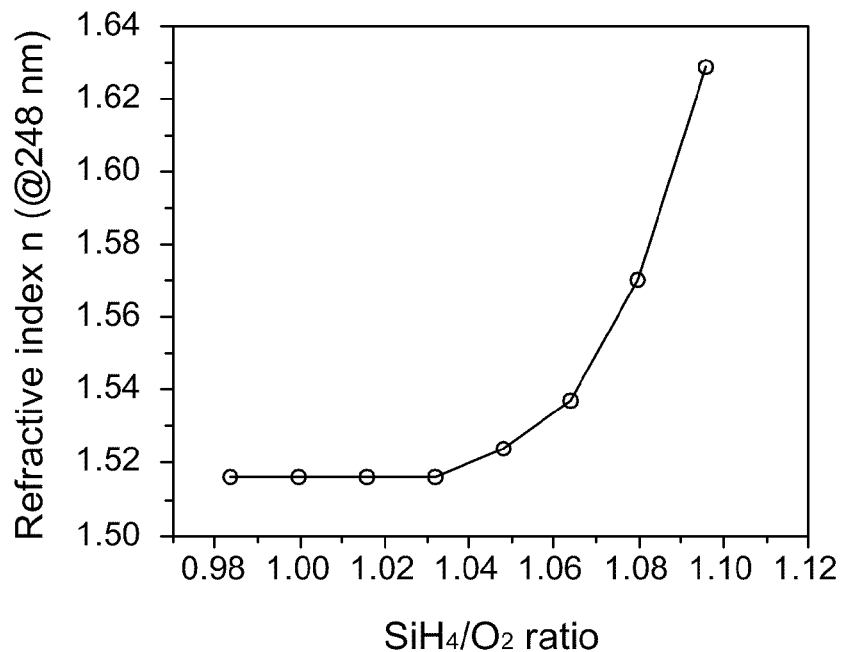
FIG. 4 illustrates the relation between the refractive index of the material and the ratio of the gas flow of silane to oxygen.

Then, a stop layer 130 is formed on the base 110 and in the recess 120, as shown in FIG. 3B. In detail, the stop layer 130 covers the upper surface of the base 110 and also extends along the inner surface of the recess 120. The stop layer 130 is made of high density plasma oxide, and preferably the refractive index of the stop layer 130 is more than 1.52, which is measured at 248 nm. When the stop layer 130 is performed by a high density plasma chemical vapor deposition (CVD) machine, such as Novellus Tool, the condition of the machine could be so set as follows that the refractive index of the stop layer be more than 1.52. The source power is ranged from 2000 to 4000 W. The bias power is ranged from 1000 to 4000 W. The gas flow of silane ($SiH_4$) is ranged from 100 to 150 sccm, and the gas flow of oxygen ($O_2$) is ranged from 80 to 200 sccm. Referring to FIG. 4, illustrating the relation between the $SiH_4/O_2$ ratio and the refractive index according to the present invention. The gas flow ration of silane to oxygen is preferably more than 1.04 when the stop layer 130 is deposited so as to allow the refractive index of the stop layer 130 to be more than 1.52. It also indicates that the refractive index rises sharply when the gas flow ration of silane ($SiH_4$) to oxygen($O_2$) is higher than 1.04. The higher refractive index of the stop layer 130 can be achieved by adjusting the ratio of silane to oxygen of the CVD recipe. More preferably, the gas flow ration of silane to oxygen is preferably between 1.04 and 2 when the stop layer 130 is deposited so as to allow the refractive index of the stop layer 130 to be more than 1.52 and less than 2.

Figure 3C:
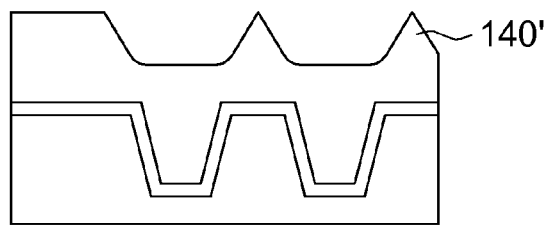

Next, a dielectric material 140' is formed on the stop layer 130 so as to allow the rest of the recess to be filled with the dielectric material 140', as shown in FIG. 3C. The dielectric material 140' is also piled onto the upper surface of the base 110 to form a spire thereon. Both the material of the stop layer 130 and the dielectric material 140' is deposited oxide, preferably high plasma density oxide. More preferably, the deposition of the stop layer 130 and the dielectric material 140' are sequentially performed by the same deposition machine, such as high density plasma chemical vapor deposition (CVD) machine. In spite of being deposited in the same machine, the refractive index of the dielectric material 140' is different from that of the stop layer 130 by adjusting the deposition recipe. FIG. 4 illustrates the relation between the refractive index of the material and the gas flow ratio of silane to oxygen. The X-axis represents the gas flow ration of silane to oxygen during the deposition operation, and the Y-axis represents the refractive index of the deposited layer which is measured at 248 nm. Referring to FIG. 4, the gas flow ration of silane to oxygen is less than 1.03 when the dielectric material 140' is deposited, and the refractive index of the dielectric material 140' (as well as the dielectric layer 140 in FIG. 3D) stays at about 1.52. Once the gas flow ration of silane to oxygen is above 1.04, the refractive index of the deposited layer rises above 1.52 with an increase in the gas flow ration of silane to oxygen. In order to distinguish the dielectric material 140' and the stop layer 130 during the proceeding CMP procedure, the refractive index of the dielectric material 140' (as well as the dielectric layer 140 in FIG. 3D) is preferably less than the refractive index of the stop layer 130. The refractive index of the dielectric material 140' is preferably less than 1.52.

Afterward, the dielectric material 140' over the base 110 is removed by performing a chemical mechanical polishing (CMP) process. The CMP process is an abrasive technique that typically includes the use of a combination of chemical agents, i.e. slurry, and mechanical agents, i.e. polishing pad, to remove material from a surface of a semiconductor device. The slurry oxidizes the material of the top layer, and the polishing pad mechanically removes the oxides from the surface of the semiconductor device. One critical point in CMP process is how to determine whether the polishing process is complete or not. If an excessive amount of material is removed (that is, overpolishing), the semiconductor device is rendered unusable. If an insufficient amount of material is removed (that is, underpolishing), the semiconductor device must be reloaded into the CMP apparatus for further processing.

Figure 3D:
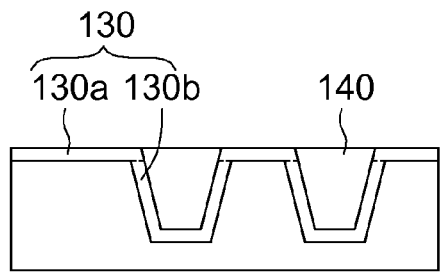

The endpoint of the CMP process can be determined by distinguishably removal rate of the stop layer 130 and the dielectric material 140'. The slurry used in the CMP process is ceria ($CeO_2$) based slurry. The deposited oxide layer 130 and 140', whose refractive index is different, is different in the CMP removal rate or amount. The dielectric material 140' of lower refractive index is etched faster than the stop layer 130 of higher refractive index does. Initially, the polishing machine is applied to the top surface of the semiconductor device, and the dielectric material 140' is removed downwardly. Once the polishing machine comes to the part 130a of the stop layer 130, the removal rate slows down and indicates the endpoint of the CMP process. Once the associated change in removal rate is detected, the CMP process should be stop. As such, the CMP process is stopped when a part 130a of the stop layer 130 is exposed. A flat and dielectric layer 140 is formed in the recess 120, as shown in FIG. 3D.

Figure 5:
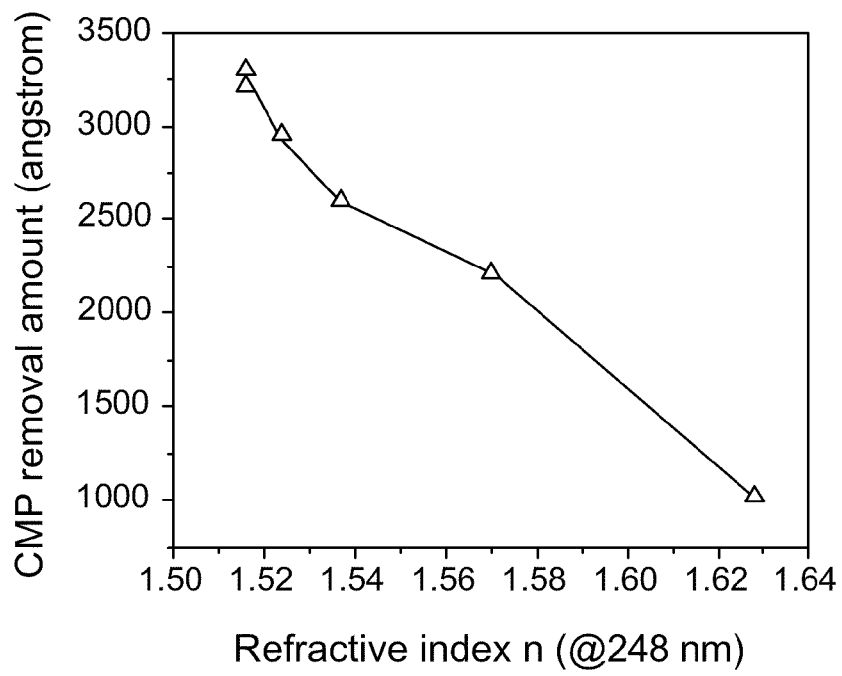
FIG. 5 illustrates the relation between the CMP removal amount and the refractive index of the material.

The more difference in refractive index between the stop layer 130 and the dielectric material 140' is, the more difference in CMP removal rate therebetween is. Thus, the endpoint of the CMP process can be determined more easily. Referring to FIG. 5, schematically illustrating the relation between the CMP removal amount and the refractive index of the material. The X-axis represents the refractive index of the deposited layer which is measured at 248 nm, and the Y-axis represents the CMP removal amount when the deposited layer undergoes the chemical and mechanical polishing. The slurry used in the CMP process is ceria ($CeO_2$) based slurry. The higher the refractive index of the deposited oxide layer is, the less the CMP removal amount per minutes is. That is, the deposited layer of a high refractive index is hard to be polished away. The ratio of the material removal rate of one material to that of another material is defined as the selectivity of the CMP process. FIG. 6 is a chart to illustrate the relation among the refractive index, CMP removal amount, and the selectivity. The relation between the refractive index and the CMP removal amount per minute has been schematically shown in FIG. 5, but the numeric data is repeatedly shown to calculate the selectivity. The selectivity between two layers A and B is quotient obtained by dividing CMP removal rated of the layer A by that of the layer B. For example, the CMP removal amount of a deposited layer A, whose refractive index RI is 1.516, during a predetermined period is 3300 A, the CMP removal rate of a deposited layer B, whose refractive index RI is 1.524, during the same predetermined period is 2954 A, and the selectivity between two layers is 1.12 obtained by dividing 3300 by 2954. The data also shows the selectivity between two layers of various refractive index. In order to maximize the selectivity between the dielectric material 140' and the stop layer 130, the dielectric material 140' preferably have refractive index lower than 1.52. The stop layer 130 preferably have refractive index higher than 1.52, such as from 1.524 to 1.628 with the above experimental data. The refractive index of the stop layer 130 reaching up to about 2.0 is also acceptable. The CMP selectivity, therefore, of the stop layer 130 to the dielectric material 140' is ranging from 1.12 to 3.23. It allows to easily and precisely catch the endpoint of the CMP process. Based on the selectivity of the CMP process discussed above, the thickness of the stop layer 130 is preferably more than 100 angstrom.

Figure 3E:
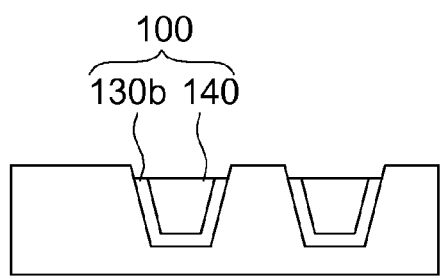

Finally, the part 130a of the stop layer 130 is removed by acidic solution, such as hydrofluoric acid (HF). Another part 130b of the stop layer 130 and the dielectric layer 140 filled in the recess (122 of FIG. 3A) constitute the isolation structure 100, as shown in FIG. 3E. The isolation structure 100 of the first embodiment is a shallow trench isolation (STI) structure, and can be widely applied to various semiconductor device, such as DRAM, memory.

Second Embodiment

Figure 7C:
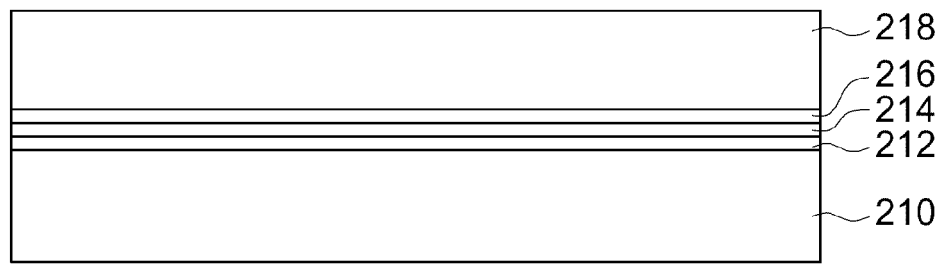
Figure 7D:
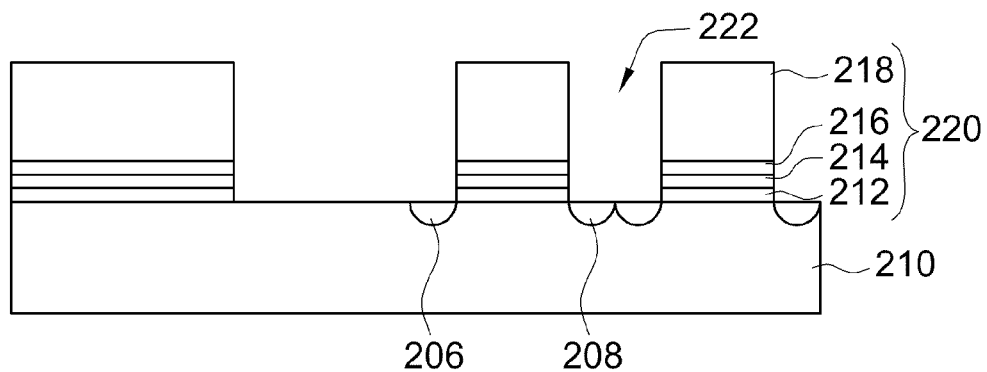

Referring to FIG. 7A~7H, schematically illustrating a method of forming a non-volatile memory according to the second embodiment of the present invention. The method of forming a non-volatile memory includes following steps. Firstly, a substrate 210 is provided as shown in FIG. 7A. Then, as shown in FIG. 7B, a gate insulating layer 212 is formed on the substrate 210, a charge storage layer 214 is formed on the gate insulating layer 214. A blocking layer 216 is preferably formed on the charge storage layer 214. The gate insulating layer 212, the charge storage layer 214 and the blocking layer 216 are preferably an ONO layer, which consists of a bottom oxide layer, a nitride layer and a top oxide layer. Next, a gate electrode layer 218 is formed over the charge storage layer 214, as shown in FIG. 7C. The gate electrode layer 218 is preferably formed on the blocking layer 216, and made of polysilicon. Afterward, the gate insulating layer 212, the charge storage layer 214, the blocking layer 216 and the gate electrode layer 218 are patterned, as shown in FIG. 7D. A plurality of stacking units 220, which at least includes layers 212, 214, 216 and 218, are separately formed on the substrate 210, and a recess 222 is positioned between every two stacking units 220. The recess 222 is bounded by the top surface of the substrate 210 and two lateral surface of two respective stacking units 220.

Then, a source region 206 and a drain region 208 are formed in the substrate 210 at two sides of the stacking units 220, as shown in FIG. 7D. The substrate 210 preferably undergoes two implantation processes, so that a two doped region, i.e. source region 206 and drain region 208, are formed at two sides of each stacking unit 220 and buried in the substrate 210.

Figure 7E:
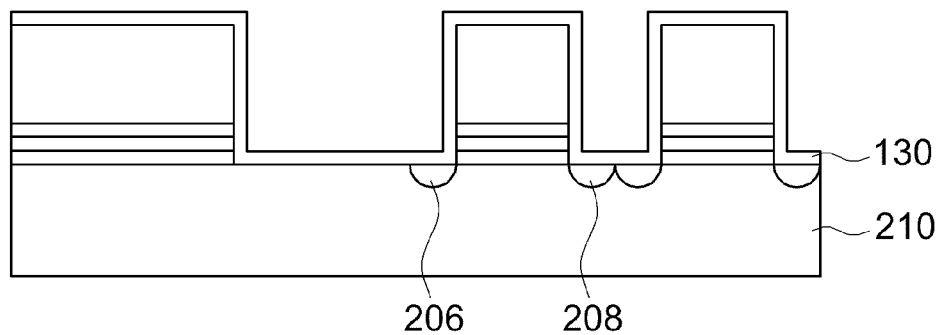

Next, a stop layer 130 is formed in each of the recess and over the stacking units 220, as shown in FIG. 7E. The stop layer 130 covers the top surface of the semi-finished product of FIG. 7D. In detail, the stop layer 130 covers the top surface of the source region 206 and the drain region 208 buried in the substrate 210, and also extends along both the top surface and the lateral surface of the stacking units 220. The method of forming the stop layer 130 of the present embodiment is similar to that of the first embodiment, except for the elements in contact with. Similarly, the stop layer 130 is made of high density plasma oxide, and preferably the refractive index of the stop layer 130 is more than 1.52, which is measured at 248 nm. When the stop layer 130 is performed by a high density plasma chemical vapor deposition (CVD) machine, such as Novellus Tool, the gas flow ration of silane to oxygen is preferably more than 1.04 when the stop layer 130 is deposited so as to allow the refractive index of the stop layer 130 to be more than 1.52.

Figure 7F:
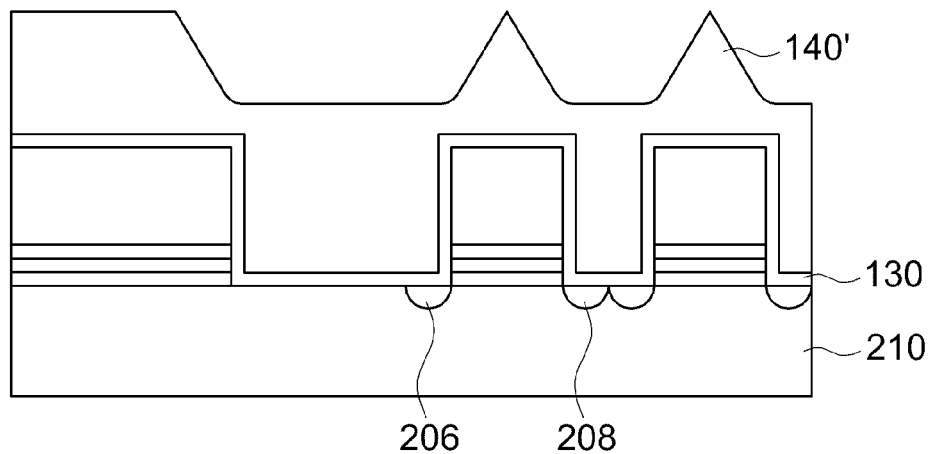

Afterward, a dielectric material 140' is formed on the stop layer 130 so as to allow the rest of the recess 222 to be filled with the dielectric material 140', as shown in FIG. 7F. The dielectric material 140' is also piled onto the upper surface of the stacking units 220 to form a spire thereon. The method of forming the dielectric material 140' of the present embodiment is similar to that of the first embodiment. Both the material of the stop layer 130 and the dielectric material 140' is deposited oxide, preferably high plasma density oxide. More preferably, the deposition of the stop layer 130 and the dielectric material 140' are sequentially performed by the same deposition machine, such as high density plasma chemical vapor deposition (CVD) machine. However, the refractive index of the dielectric material 140' (as well as the dielectric layer 140 in FIG. 7H) is preferably less than the refractive index of the stop layer 130 by adjusting the ratio of the gas flow of silane to oxygen. The refractive index of the dielectric material 140' is preferably less than 1.52.

Figure 7G:
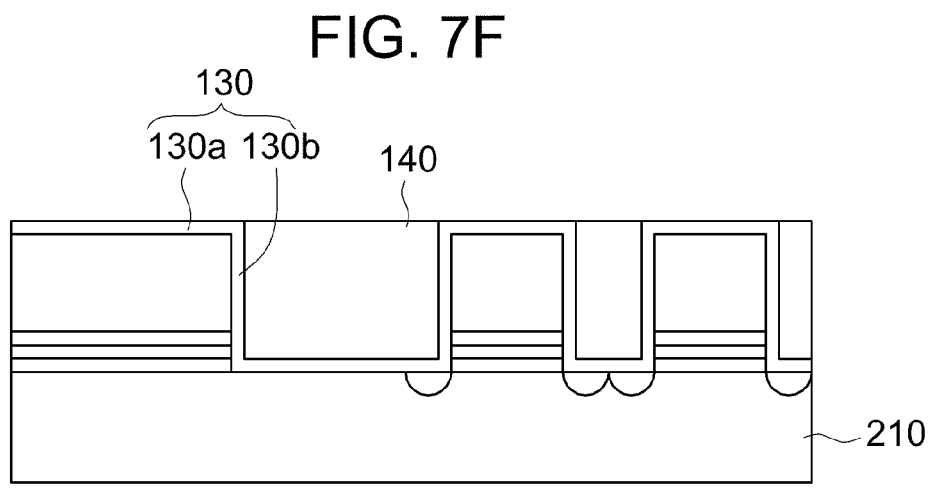

Afterward, the dielectric material 140' over the substrate 210 and stacking units 220 is removed by performing a chemical mechanical polishing (CMP) process until a part 130a of the stop layer 130 is exposed so as to form a dielectric layer 140 in each of the recess 222, as shown in FIG. 7G.

Figure 7H:
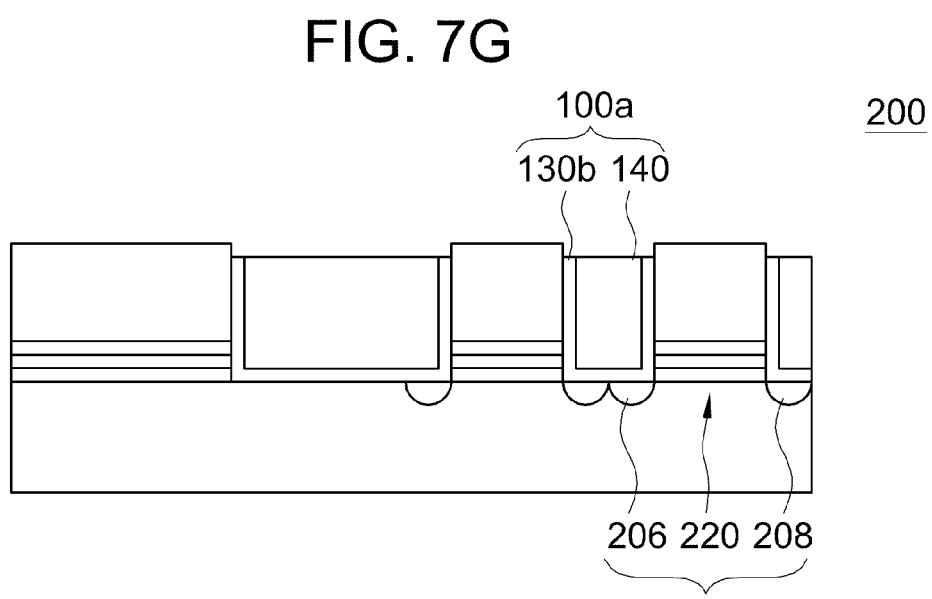

Finally, the part 130a of the stop layer 130 is removed by acidic solution, such as hydrofluoric acid (HF). Another part 130b of the stop layer 130 and the dielectric layer 140 filled in the recess (222 of FIG. 7D) constitute the isolation structure 100a, as shown in FIG. 7H. The isolation structure 100a of the second embodiment is a buried diffusion oxide (BD oxide), which is interposed between two stacking units 220 for isolation two neighboring stacking units 220 or memory cells 250.

Referring to FIG. 7H, a non-volatile memory according to the second embodiment of the present invention includes a substrate 210, a plurality of memory cells 250 and isolation structure 100a. Each memory cell 250 includes a stacking unit 220, a source region 206 and a drain region 208. The stacking unit 220 is formed on the substrate 210, and at least includes a gate insulating layer (212 of FIG. 7D), a charge storage layer (214 of FIG. 7D) and a gate electrode (218 of FIG. 7D) stacked on the substrate 210. The source region 206 and a drain region 208 are buried in the substrate 210 and respectively located at two sides of the stacking units 220. The isolation structure 100a is formed on the substrate 210 and between two stacking units 250. The isolation structure 100a includes a first deposited oxide layer (i.e. stop layer 130) and a second deposited oxide layer (i.e. dielectric layer 140). The first deposited oxide layer (i.e. stop layer 130) extends on the substrate 210 between two stacking units 220, and also deposited on a lateral surface of the stacking units 220. The second deposited oxide layer (i.e. dielectric layer 140) is formed on the first deposited oxide layer (i.e. stop layer 130). The refractive index of the second deposited oxide layer (i.e. dielectric layer 140) is less than the refractive index of the first deposited oxide layer (i.e. the stop layer 130).

The refractive index of the second deposited oxide layer (i.e. dielectric layer 140) is preferably less than 1.52. The refractive index of the first deposited oxide layer (i.e. stop layer 130) is more than 1.52, preferably, more than 1.524. More preferably, the refractive index of the first deposited oxide layer (i.e. stop layer 130) is more than 1.54. The first deposited oxide layer (i.e. stop layer 130) is thicker than 100 angstroms.

As described hereinbefore, the isolation structure, the non-volatile memory having the same and the method of fabricating the same, has at least following listed advantages. Compared to the traditional LOCOS, the method of forming the isolation structure according to the preferred embodiment completely avoids the bird's beak shape characteristic. With its zero oxide field encroachment the method of the present embodiments is more suitable for the increased density requirements, because it allows to form smaller isolation regions. It allows to be the preferred isolation technique for the sub-0.5 μm technology. Compared to the conventional STI, the stop layer and the dielectric layer of the present embodiments are in-situ deposited. That is, the formation of two layers can be executed in the same machine, and the refractive index of them can be different by simply changing the gas flow during deposition. As such, the method of the present embodiments has less number of different process steps and lower cost.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of forming an isolation structure, comprising:
providing a base having a recess;
forming a stop layer on the base and on two inner sides and a bottom surface of the recess simultaneously;
forming a dielectric material on the stop layer so as to allow the rest of the recess to be filled with the dielectric material, wherein the stop layer and the dielectric material are formed by a same machine;
removing the dielectric material over the base by performing a chemical mechanical polishing (CMP) process until a part of the stop layer is exposed so as to form a dielectric layer in the recess, wherein the etching rate of the dielectric layer is higher than the etching rate of the stop layer; and
removing a part of the stop layer, wherein the remaining stop layer on the inner sides and on the bottom surface of the recess constitute the isolation structure.

2. The method according to claim 1, wherein the machine is a high density plasma chemical vapor deposition (CVD) machine, and wherein the stop layer and the dielectric material are formed by in situ deposition.

3. The method according to claim 2, wherein when the stop layer is deposited, gas flow ratio of $SiH_4$ to $O_2$ is between 1.04 and 2.

4. The method according to claim 1, wherein the stop layer is made of high density plasma oxide.

5. The method according to claim 1, wherein the refractive index of the dielectric layer is less than the refractive index of the stop layer.

6. The method according to claim 1, wherein the refractive index of the dielectric layer is between 1.4 and 1.52.

7. The method according to claim 1, wherein the refractive index of the stop layer is more than 1.52 and less than 2.

8. The method according to claim 1, wherein the refractive index of the stop layer is more than 1.524 and less than 2.

9. The method according to claim 1, wherein the refractive index of the stop layer is more than 1.54 and less than 2.

10. The method according to claim 1, wherein the isolation structure is shallow trench isolation (STI), and the base is a substrate.

11. The method according to claim 1, wherein the isolation structure is for the isolation of neighboring memory cells, the step (a) further comprising:
providing a substrate;
forming gate insulating layer on the substrate;
forming a charge storage layer on the gate insulating layer;
forming a gate electrode layer on the charge storage layer;
patterning the gate insulating layer, the charge storage layer and the gate electrode layer to form a plurality of stacking units on the substrate separately so as to allow the recess to be formed between every two stacking units.

12. A method of forming a non-volatile memory, comprising:
providing a substrate;
forming a plurality of stacking units separately on the substrate so as to allow a recess to be formed between every two stacking units;
forming a source region and a drain region in the substrate at two sides of the each stacking unit;
forming a stop layer on the lateral surfaces of the stacking units and on a bottom surface of the recess and over the stacking units simultaneously;
forming a dielectric material on the stop layer so as to allow the rest of the recess to be filled with the dielectric material, wherein the stacking units are separated from the dielectric material by the stop layer on the lateral surfaces of the stacking units, and the substrate is separated from the dielectric material by the stop layer on the bottom surface of the recess;
removing the dielectric material over the substrate by performing a chemical mechanical polishing (CMP) process until a part of the stop layer is exposed so as to form a dielectric layer in each of the recess, wherein the etching rate of the dielectric layer is higher than the etching rate of the stop layer; and removing the part of the stop layer, wherein the remaining stop layer on the lateral surfaces of the stacking units and on the bottom surface of the recess is for isolation two neighboring stacking units.

13. The method according to claim 12, wherein the stop layer and the dielectric material are formed by a same machine.

14. The method according to claim 12, wherein the machine is a high density plasma chemical vapor deposition (CVD) machine, and wherein the stop layer and the dielectric material are formed by in situ deposition.

15. The method according to claim 14, wherein when the stop layer is deposited, gas flow ratio of $SiH_4$ to $O_2$ is between 1.04 and 2.

16. The method according to claim 12, wherein the stop layer comprises high density plasma oxide.

17. The method according to claim 12, wherein the refractive index of the dielectric layer is less than the refractive index of the stop layer.

18. The method according to claim 12, wherein the refractive index of the dielectric layer is between 1.4 and 1.52.

19. The method according to claim 12, wherein the refractive index of the stop layer is more than 1.52 and less than 2.

20. The method according to claim 12, wherein the refractive index of the stop layer is more than 1.524 and less than 2.

21. The method according to claim 12, wherein the refractive index of the stop layer is more than 1.54 and less than 2.

22. The method according to claim 12, wherein the step (b) further comprising:

forming gate insulating layer on the substrate;

forming a charge storage layer on the gate insulating layer;

forming a gate electrode layer over the charge storage layer;

patterning the gate insulating layer, the charge storage layer and the gate electrode layer to form a plurality of stacking units on the substrate separately so as to allow the recess to be formed between every two stacking units.

* * * * *